United States Patent [19]
Takano et al.

[11] Patent Number: 5,677,615
[45] Date of Patent: Oct. 14, 1997

[54] SERVICE-LIFE DISCRIMINATING FEATURE ADDED TO A BATTERY CHARGER

[75] Inventors: Nobuhiro Takano; Shigeru Shinohara, both of Hitachinaka, Japan

[73] Assignee: Hitachi Koki Co., Ltd., Tokyo, Japan

[21] Appl. No.: 386,628

[22] Filed: Feb. 10, 1995

[30] Foreign Application Priority Data

Feb. 10, 1994 [JP] Japan .................................. 6-016369

[51] Int. Cl.$^6$ .................................................. H01M 10/46
[52] U.S. Cl. ........................ 320/35; 320/39; 320/48
[58] Field of Search ............................ 320/4, 5, 12, 13, 320/30, 35, 39, 48

[56] References Cited

U.S. PATENT DOCUMENTS 4,313,079  1/1982  Lee ............................................. 320/48

FOREIGN PATENT DOCUMENTS 3625905  7/1987  Germany.

OTHER PUBLICATIONS

"Nickel-Metallhydrid-Akkus Schnell und Sicher Laden", Wilfried Blaesner, Elektronik 18/1994, pp. 64–69.

*Primary Examiner*—Edward Tso
*Attorney, Agent, or Firm*—Sughrue, Mion, Zinn, Macpeak & Seas, PLLC

[57] ABSTRACT

To discriminate that a rechargeable battery has reached an end of life, the maximum battery voltage detected during a preliminary charge time is compared with a predetermined reference voltage. When the comparison results indicate that the battery voltage is above the predetermined reference voltage, it is determined that the battery has reached the end of life.

8 Claims, 6 Drawing Sheets

SERVICE-LIFE DISCRIMINATING FEATURE ADDED TO A BATTERY CHARGER

BACKGROUND OF THE INVENTION

1. Field of the Invention

The present invention relates to a battery charger for charging rechargeable batteries such as nickel-cadmium battery (hereinafter referred to as "Ni-Cad battery"). More particularly, the invention relates to a rechargeable battery service-life discriminating device which indicates the end of life of the rechargeable battery.

2. Description of the Related Art

Rechargeable batteries are generally used in battery powered devices because they can stand repetitive use. Whenever the batteries are found to be discharged, they are removed from the devices on which the batteries are mounted, and are again mounted thereon after charging. However, as shown in FIG. 3, the dischargeable capacity of the batteries is abruptly lowered when the charge/discharge repetitions have reached a certain limit number. That is, the rechargeable batteries have a service life and repetitive use thereof is no longer possible when the batteries have reached their end of life.

The batteries will reach their end of life when the internal impedance of the battery increases caused by the leakage of electrolyte as shown in part (b) of FIG. 3, or when the battery is internally short-circuited caused by deterioration of a separator made of an organic material or by lowering of electrode strength. Particularly, the leakage of electrolyte is the major cause for the batteries with a number of cells connected in series. Having a variation in capacitance of the number of cells, the least capacitance cell is forced to overcharge and overdischarge repeatedly.

Conventionally, the determination as to whether or not the battery has reached the end of life is made by a user depending solely on his practical experience. However, the user does not recognize the lowering of the battery capacitance and that the battery has reached the end of life until the electrolyte is leaked out from the battery and corrodes electrical components of the battery charger, thereby causing the charger to become faulty. In view of the foregoing, it has been required to provide a device capable of reliably notifying the operator of the end of life of the battery. It has further been required to comply with the requirement of users who wish to know when the batteries in use should be exchanged with new ones, particularly for those who use battery powered tools driven under a heavy load in which the batteries are repeatedly used under a large discharge rate.

SUMMARY OF THE INVENTION

The present invention has been made to solve the above-described problems, and it is accordingly an object of the present invention to provide a rechargeable battery service-life discriminating device which reliably indicates the end of life of the rechargeable battery.

To achieve the above and other objects, the present invention provides a rechargeable battery service-life discriminating device for discriminating an end of life of a rechargeable battery. There are provided charging means for charging the battery with a charge current, battery voltage detecting means for detecting a battery voltage reached when a predetermined period of time has expired from a start of charge. First comparison means is provided for comparing the battery voltage detected by the battery voltage detecting means with a predetermined reference voltage. Determining means is provided for determining that the battery has reached the end of life when the first comparison means indicates that the battery voltage is above the predetermined reference voltage.

Temperature detecting means is further provided for detecting a battery temperature at the start of charge. Second comparison means is also provided for comparing the battery temperature detected by the temperature detecting means with a predetermined reference temperature. When the second comparison means indicates that the battery temperature is lower than the predetermined reference temperature, the charge current is set to have a second level smaller than a first level set when the battery temperature is equal to or higher than the predetermined reference voltage.

The predetermined reference voltage is changed depending on the battery temperature. The predetermined reference voltage is changed depending further on the charge current.

According to another aspect of the invention, there is provided a battery charger for charging a rechargeable battery having a plurality of cells connected in series. The battery charger includes charging means for charging the battery with a charge current, and battery voltage detecting means for detecting a maximum voltage of the battery marked during a predetermined period of time from a start of charge. End-of-life detecting means is provided for detecting that the battery has reached an end of life based on the maximum voltage of the battery detected by the battery voltage detecting means and producing an end-of-life signal. Indicating means indicates that the battery has reached the end of life in response to the end-of-life signal.

Temperature detecting means is provided for detecting a battery temperature at the start of charge. The charge current is determined by the charging means depending on the battery temperature.

Preferably, the battery charger includes cell number detecting means for detecting the cell number of the battery. The end-of-life detecting means detects that the battery has reached the end of life based further on the cell number of the battery.

BRIEF DESCRIPTION OF THE DRAWINGS

The particular features and advantages of the invention as well as other objects will become apparent from the following description taken in connection with the accompanying drawings, in which.

DETAILED DESCRIPTION OF THE PREFERRED EMBODIMENTS

A battery charger according to a preferred embodiment of the present invention will be described while referring to the accompanying drawings.

Figure 1:
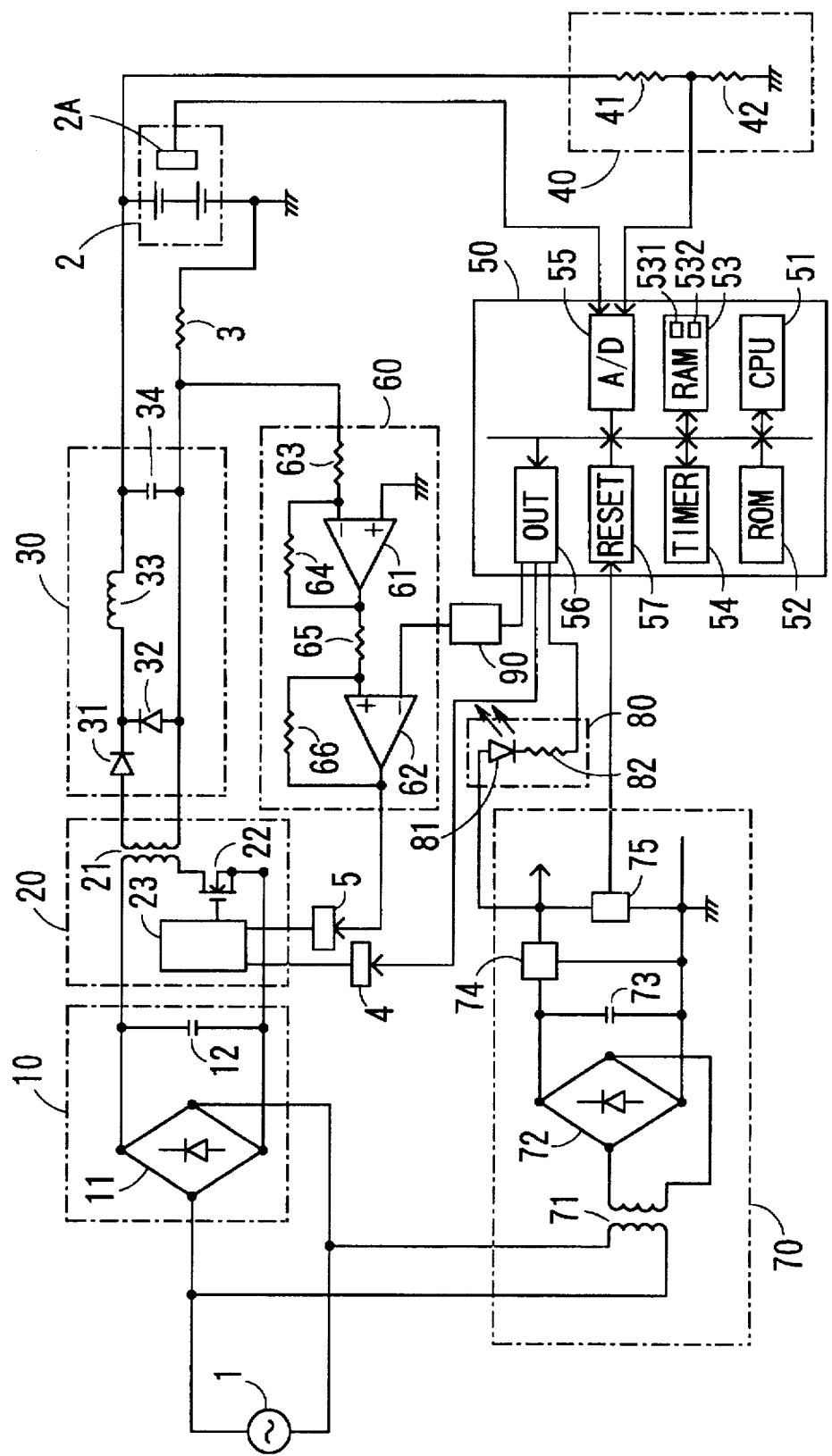
FIG. 1 is a circuit diagram showing an arrangement of the battery charger according to the present invention.

To charge a rechargeable battery 2 with the battery charger shown in FIG. 1, the battery 2 is connected between a rectifying/smoothing circuit 30 (to be described later) and ground. The battery charger includes a battery temperature detection section 2A for detecting battery temperature. In this embodiment, a thermistor is used in the battery temperature detection section 2A. The battery temperature detection section 2A is disposed so as to be in contact with or disposed in proximity to the battery. The battery 2 consists of a plurality of cells connected in series.

The battery charger includes a resistor 3 serving as a current detection means for detecting a charge current flowing in the battery 2. A rectifying/smoothing circuit 10 is connected to an A.C. power source 1 for converting the A.C. voltage to D.C. voltage. The circuit 10 includes a full-wave rectifier 11 and a smoothing capacitor 12. A switching circuit 20 is connected to the output of the rectifying/smoothing circuit 10 and includes a high frequency transformer 21, a MOSFET 22, and a PWM (pulse width modulation) controlling IC 23. This IC 23 changes the width of driving pulses applied to the MOSFET 22. With the switching actions performed by the MOSFET 22, pulsating voltage is developed at the secondary side of the transformer 21. Another rectifying/smoothing circuit 30 is connected to the output of the switching circuit 20. The circuit 30 includes diodes 31, 32, a choke coil 33, and a smoothing capacitor 34. A battery voltage detection section 40 is connected in parallel to the battery 2 and is made up of two resistors 41 and 42 connected in series so that the voltage across the battery 2 is divided with a ratio of resistances of the two resistors. The output of the battery voltage detection section 40 is taken out from the junction of the resistors 41 and 42.

The battery charger further includes a microcomputer 50 having a CPU 51 (serving as a calculation means), a ROM 52, a RAM 53, a timer 54, an A/D converter 55, an output port 56, and a reset input port 57 which are mutually connected by a bus. The RAM 53 includes a first storage region 531 for storing therein sampled battery voltages and a second storage region 532 for storing therein sampled battery temperature values. The first storage region 531 serves as a battery voltage storage means and the second storage region 532 as a battery temperature storage means. A charge current controlling section 60 is connected between the current detection section (resistor) 3 and the switching circuit 20 to maintain the charge current at a predetermined level. The charge current controlling section 60 includes cascade-connected operational amplifiers 61 and 62, and resistors 63 through 66.

A constant voltage power supply 70 is provided for supplying constant voltages to the microcomputer 50 and the charge current controlling section 60. The constant voltage power supply 70 includes a transformer 71, a full-wave rectifier 72, a smoothing capacitor 73, a three-terminal voltage regulator 74, and a reset IC 75. The reset IC 75 issues a reset signal to the reset input port 57 of the microcomputer 50 to reset the same. A battery's end of life (EOL) display section 80 is connected between the constant voltage power supply 70 and the output port 56 of the microcomputer 50 for indicating the end of life of the battery 2. The EOL display section 80 includes an LED (light emitting diode) 81 and a resistor 82. A charge current determining section 90 is connected between the output port 56 of the microcomputer 50 and the inverting input terminal of the cascade-connected operational amplifier 62. The charge current determining section 90 determines the charge current by changing the voltage applied to the inverting input terminal of the operational amplifier 62 in correspondence to the signal outputted by the microcomputer 50.

A photo-coupler 4 serving as a charge control signal relaying means is connected between the output port 56 of the microcomputer 50 and the PWM controlling IC 23 of the switching circuit 20. The photo-coupler 4 is for transmitting from the microcomputer 50 signals for controlling start and stop of charging. Another photo-coupler 5 serving as a charge current signal transmission means is connected between the output of the operational amplifier 62 of the charge current controlling section 60 and the PWM control IC 23. The photocoupler 5 is for returning the charge current signal to the PWM control IC 23.

Next, description will be provided with respect to battery voltage characteristic curves of normal batteries which are still usable (hereinafter referred to as "usable batteries") and batteries which have reached the end of life (hereinafter referred to as "EOL batteries").

Figure 4:
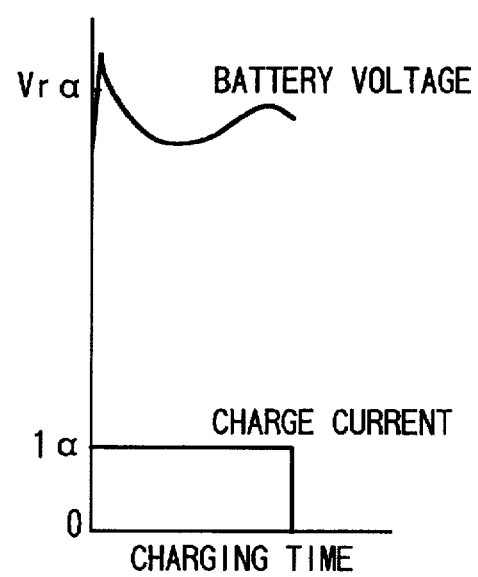
FIG. 4 is a graphical representation showing a charging characteristic of a dead battery.

FIG. 4 shows a battery voltage characteristic curve of an EOL battery which is charged with a first charge current Iα. As can be seen in FIG. 4, the battery voltage has exceeded a first end-of-life discriminating voltage (hereinafter referred to as "first EOL discriminating voltage") Vrα at the initial stage of charge.

Figure 5:
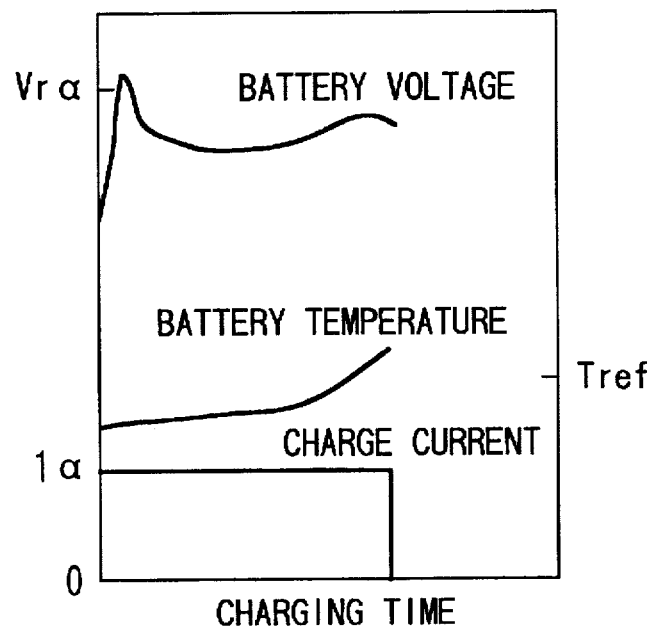
FIG. 5 is a graphical representation showing a charging characteristic of a low temperature, usable battery wherein the battery is charged with a standard level charging current.

FIG. 5 shows a battery voltage characteristic curve of a low-temperature, usable battery which is charged with the first charge current Iα. Similar to the curve shown in FIG. 4, the battery voltage has exceeded the first EOL discriminating voltage Vrα at the initial stage of charge. A low-temperature battery is defined by a battery whose initial temperature Tin as measured at the start of charge is lower than a predetermined value Tref.

Figure 6:
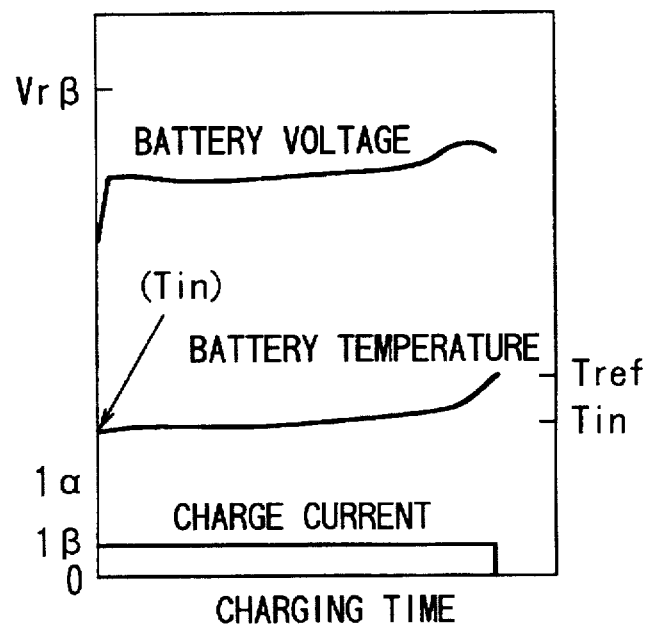
FIG. 6 is a graphical representation showing a charging characteristic of a low temperature, usable battery wherein the battery is charged with a low level charging current.

FIG. 6 shows a battery voltage characteristic curve of a low-temperature, usable battery which is charged with a second charge current Iβ smaller in level than the first charge current Iα. As seen in FIG. 6, the battery voltage has not exceeded a second end-of-life discriminating voltage (hereinafter referred to as "second EOL discriminating voltage") Vrβ at the initial stage of charge.

Figure 7:
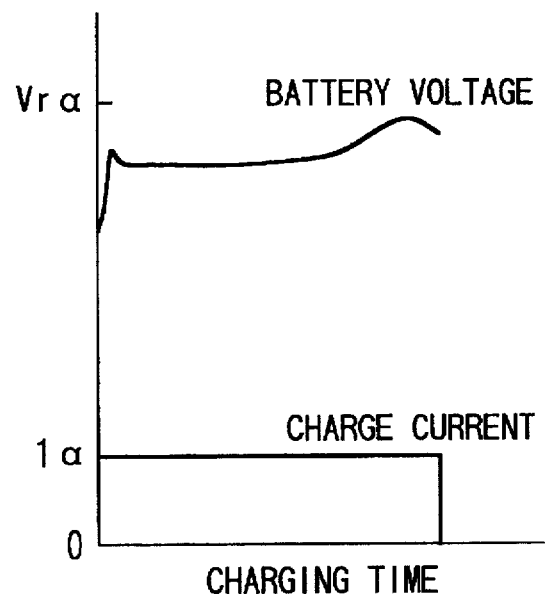
FIG. 7 is a graphical representation showing a charging characteristic of a long-term unused battery.

FIG. 7 shows a battery voltage characteristic curve of a usable battery which has been left unused for a long time but whose temperature is not as low as the low-temperature battery. The battery is charged with the first charge current Iα. Although the battery voltage moderately increases at the initial stage of charge, it does not exceed the first EOL discriminating voltage Vrα. The rate of increase of the voltage during the initial charge period is not as large as the rate of increase of the voltage in the unusable battery which is charged under the same condition (see FIG. 4).

Figure 8:
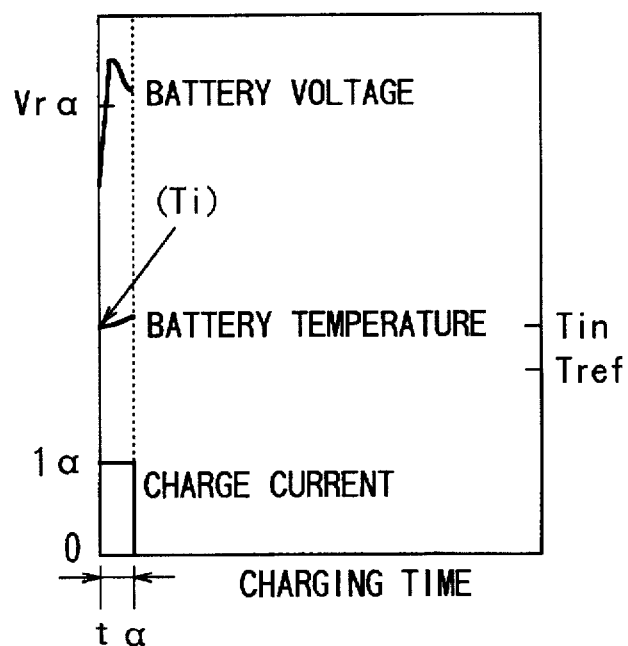
FIG. 8 is a graphical representation showing a charging characteristic of a dead battery of a normal temperature.

FIG. 8 shows a battery voltage characteristic curve of the EOL battery whose initial temperature Tin measured at the start of charge is not lower than the predetermined value Tref. The EOL battery is charged with the first charge current Iα for a duration of time tα. As seen in FIG. 8, the battery voltage has exceeded the first EOL discriminating voltage Vrα during a period of time tα from the start of charge.

Figure 9:
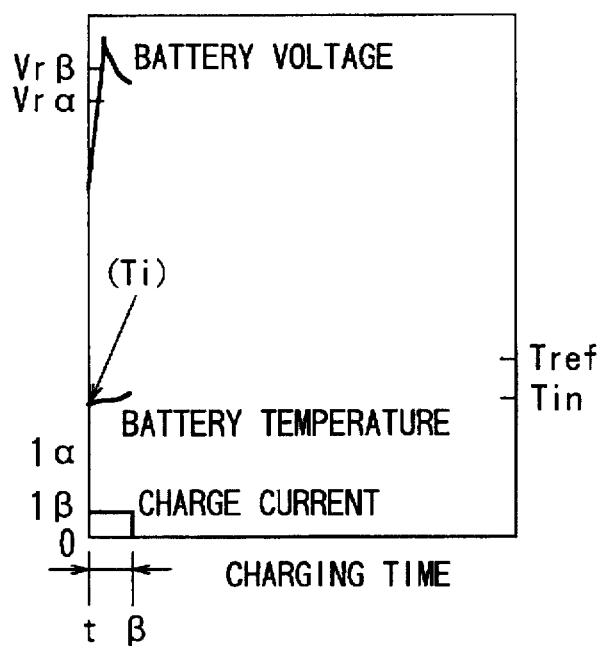
FIG. 9 is a graphical representation showing a charging characteristic of a low temperature, dead battery.

FIG. 9 shows a battery voltage characteristic curve of a low-temperature, EOL battery charged with the second charge current Iβ for a duration of time tβ. The battery voltage has exceeded the second EOL discriminating voltage Vrβ during a period of time tβ from the start of charge.

Figure 10:
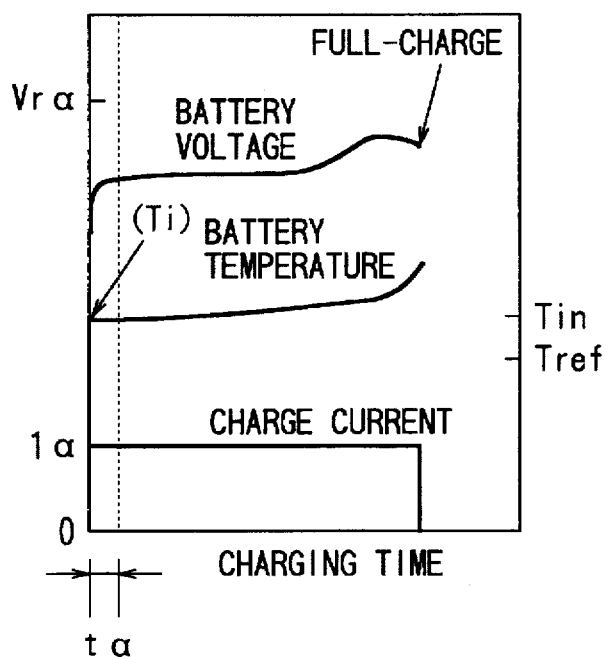
FIG. 10 is a graphical representation showing a charging characteristic of a normal battery of a normal temperature.

FIG. 10 shows a battery voltage characteristic curve of a usable battery whose initial temperature Tin measured at the start of charge is not lower than the predetermined value Tref. The battery is charged with the first charge current Iα. As seen in FIG. 10, the battery voltage has not exceeded the first EOL discriminating voltage Vrα at the initial stage of charge, that is, at a time when tα has expired from the start of charge.

Based on the various battery voltage characteristic curves described above, whether the battery in question is still usable or has reached the end of life can be discriminated by measuring the temperature of the battery at the start of charge and then determining whether the battery voltage has reached the first or second EOL discriminating voltage after the battery has been charged with either the charge current Iα or Iβ for a duration of time tα or tβ.

Figure 2:
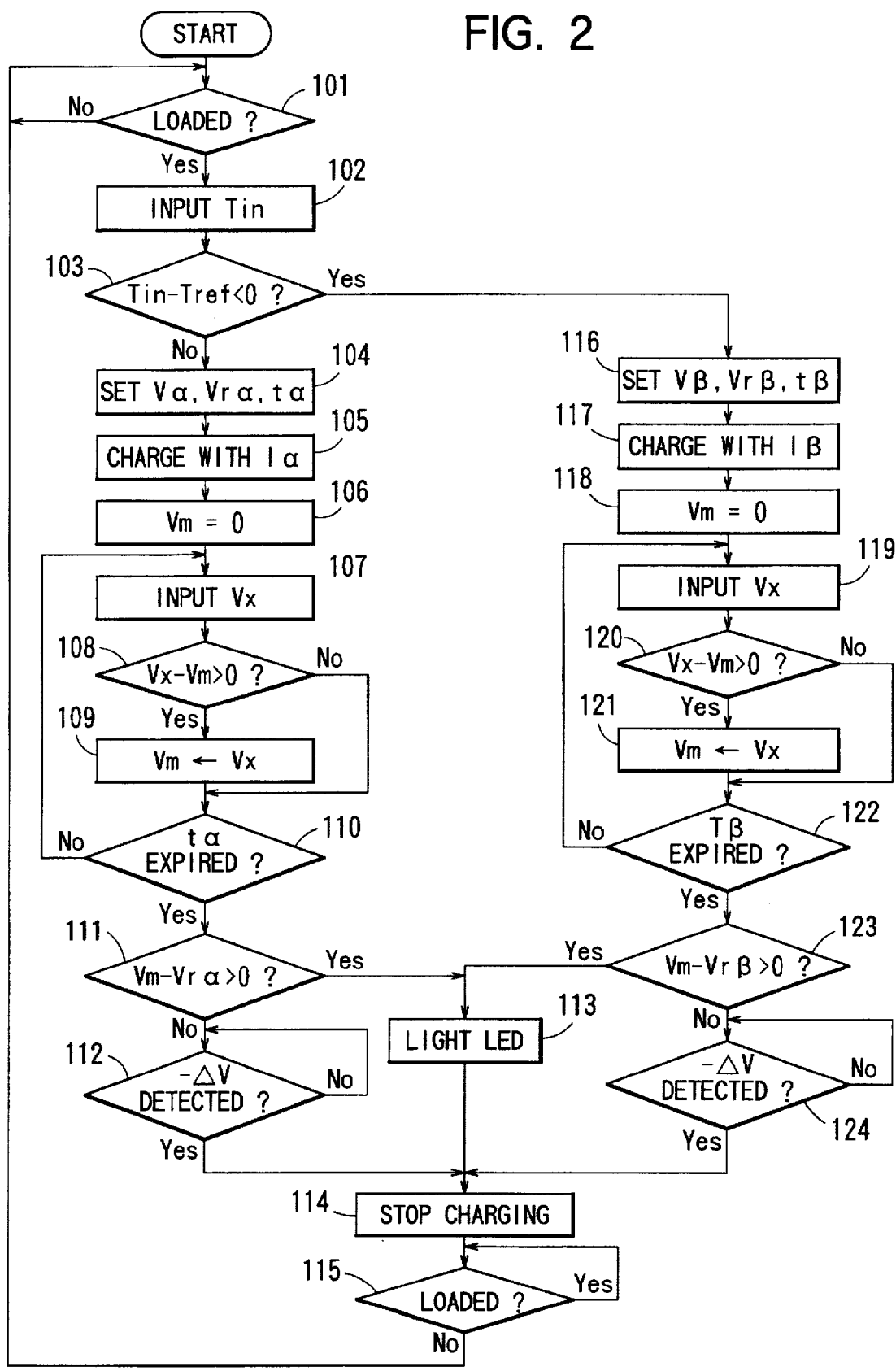
FIG. 2 is a flow chart for describing an operation of the embodiment of the present invention.
Figure 3:
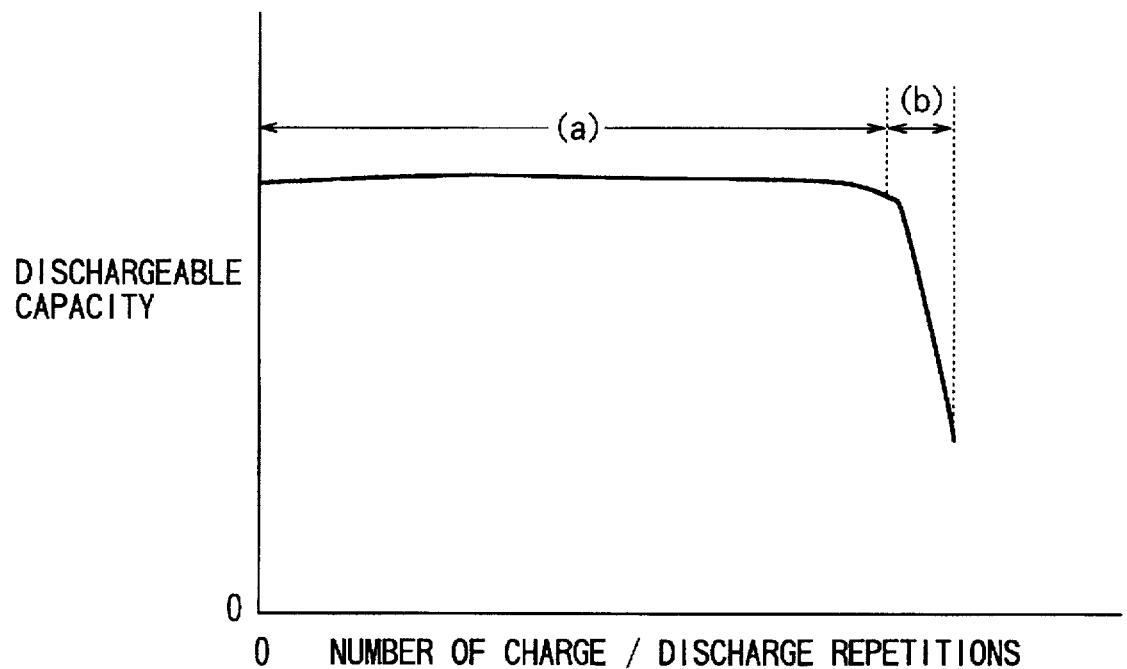
FIG. 3 is a graphical representation showing a number of charge/discharge repetitions versus dischargeable capacity of a battery.

Now, a description of operations of the battery charger will be provided while referring to the flowchart shown in FIG. 2. Hereinafter individual steps will be referred to with an "S" followed by the step number.

When power is turned ON, the microcomputer 50 goes into a standby condition until the battery 2 is determined to be loaded into the charger (S101). When, by referring to the signal outputted from the voltage detection section 40, the microcomputer 50 determines that the battery 2 is loaded or connected ("Yes" in S101), the microcomputer 50 receives an initial battery temperature Tin representative of a battery temperature measured before start of charge (S102). The terminal voltage of the thermistor 2A detected before start of charge indicates the initial battery temperature Tin and is applied to the A/D converter 55 for analog-to-digital conversion. A predetermined temperature Tref for determining whether the battery in question is low-temperature or not is subtracted from the initial battery temperature Tin and decision is made as to whether the subtracted value is positive or negative (S103).

When the subtracted value is positive, it is determined that the battery in question is not low-temperature ("NO" in S103). For such batteries, a charge current setting voltage Vα, the first EOL discriminating voltage Vrα and an initial charge time tα are set (S104). The voltage Vα is for causing to produce the charge current Iα. The level of the first EOL discriminating voltage Vrα is determined corresponding to level of the charge current Iα. When the charge current Iα is set larger, the first EOL discriminating voltage becomes larger whereas when the charge current Iα is set smaller, the first EOL discriminating voltage becomes smaller.

Then, in S105, the microcomputer 50 outputs a charge start signal from the output port 56 to the PWM control IC 23 via the charge control signal relaying section 4 and starts charging with the charge current Iα. When charging starts, the charge current applied to the battery 2 is detected at the resistor 3. The charging current controlling section 60 determines the difference between the voltage Vα and the voltage corresponding to charge current detected by the resistor 3 and then feeds back the difference to the PWM control IC 23 via the photo-coupler 5.

More specifically, the width of the pulse applied to the high frequency transformer 21 is reduced when the actual charge current is too large and increased when the actual charge current is too small. The output from the secondary winding of the high frequency transformer 21 is subjected to rectification and smoothing by the rectifying/smoothing circuit 30. In this way, the charging current is maintained at a constant level. That is, the resistor 3, the charging current controlling section 60, the photo-coupler 5, the switching circuit 20, and the rectifying/smoothing circuit 30 operate together to control the charge current at the predetermined value Iα.

Next, whether the battery has reached the end of life or not is determined based on the battery voltage detected at the initial stage of charge. To this effect, the maximum battery voltage Vm is set to zero (S106) and the battery voltages Vx detected from the start of charge are sequentially inputted to the battery voltage storage region 531 (S107). The maximum value among those stored in the battery voltage storage region 531 is held as the maximum battery voltage Vm and the updated battery voltage Vx is compared with the maximum battery voltage Vm (S108). When the updated battery voltage Vx is larger than the maximum battery voltage Vm ("Yes" in S108), the maximum battery voltage Vm is replaced by the updated battery voltage Vx (S109).

Next, it is checked if the initial charge time tα has expired from the start of charge (S110). If the initial charge time tα has not yet expired ("No" in S110), the program returns to S107 and the processes in S107 through 110 are repeatedly implemented. When the updated battery voltage Vx is equal to or less than the maximum battery voltage Vm ("No" in S109), the process in S108 is omitted and the program immediately proceeds to S110. When the initial charge time tα has expired from the start of charge ("Yes" in S110), a difference between the maximum battery voltage Vm and the first EOL discriminating voltage Vrα is computed (S111). When the difference therebetween is positive ("Yes" in S111), that is, the maximum battery voltage detected during the initial charge period exceeded the first EOL discriminating voltage Vrα, it is determined that the battery loaded in the charger exhibited the curve shown in FIG. 4 and thus concluded that the battery has reached the end of life. In this case, the microcomputer 50 issues an enable signal to the LED 81 of the EOL display section 80 so as to light the LED 81 (S113). Simultaneously, the microcomputer 50 issues the charge stop signal from the output port 56 to the PWM controlling IC 23 through the charge control signal relaying means 4 so that charging is stopped (S114). Whether or not the battery 2 has been removed from the charger is determined in S115. If so ("No" in S115), the program returns to S101, where loading of another battery is awaited.

When the difference between the maximum battery voltage Vm and the first EOL discriminating voltage Vrα is negative ("No" in S111), that is, the maximum battery voltage detected during the initial charge period did not exceeded the first EOL discriminating voltage Vrα, it is determined that the battery loaded in the charger exhibited the curve shown in FIG. 7 and thus concluded that the battery has not yet reached the end of life and is still usable. In this case, in S112, whether or not the battery 2 is fully charged is determined. Various methods are known in the art for detecting a fully charged condition of the battery. In this embodiment, a so-called −ΔV method is employed to detect the full charge condition of the battery. As the charging of the battery progresses, the battery voltage increases, reaches the peak voltage, and then goes down. According to the −ΔV method, it is determined that the battery is fully charged when after the battery voltage has reached the peak value, a predetermined voltage drop −ΔV occurred from the peak value. When the full charge is detected, the microcomputer 50 issues a charge stop signal to the PWM control IC 23 so that charging is stopped (S114). When the full charge is not detected ("No" in S112), $-\Delta V$ detection is continuously performed. Whether or not the battery 2 has been removed from the charger is determined in S115. If so ("No" in S115), the program returns to S101, where loading of another battery is awaited.

When, in S103, the subtracted value (Tin–Tref) is negative, that is, when it is detected that the predetermined temperature Tref is higher than the initial battery temperature Tin ("Yes" in S103), it is determined that the battery in question is low-temperature. For such batteries, a charge current setting voltage $V\beta$, the second EOL discriminating voltage $Vr\beta$ and an initial charge time $t\beta$ are set (S116). The voltage $V\beta$ is for causing to produce the charge current $I\beta$. Like the first EOL discriminating voltage $Vr\alpha$, the level of the second EOL discriminating voltage $Vr\beta$ is determined corresponding to level of the charge current $I\beta$. When the charge current $I\beta$ is set larger, the second EOL discriminating voltage $Vr\beta$ becomes larger whereas when the charge current $I\beta$ is set smaller, the second EOL discriminating voltage $r\beta$ becomes smaller. Therefore, the difference between $Vr\alpha$ and $Vr\beta$ changes depending on the difference between $I\alpha$ and $I\beta$. The initial charge time $t\beta$ for the low-temperature battery is set equal to or shorter than the initial charge time $t\alpha$. After setting of $V\beta$, $Vr\beta$ and $t\beta$ is completed, the initial charging, determination as to whether or not the battery has reached the end of life, and detection of full charge condition are executed in S117 through S124 similar to S105 through S112. When the battery in question is found to have reached the end of life, the LED is lit in S113. When, on the other hand, the battery is found to be still usable and the full charge condition is detected, charging of the battery is stopped in S114.

Although the present invention has been described with respect to a specific embodiment, it will be appreciated by one skilled in the art that a variety of changes and modifications may be made without departing from the scope of the invention. For example, the initial battery temperature may be compared with each of a plurality of multi-level reference values to more accurately evaluate the battery in terms of the battery temperature. The above-described embodiment assumes charging of batteries having the same number of cells connected in series. However, the end of life of the batteries having different number of cells can also be discriminated by changing the EOL discriminating voltage $Vr\alpha$ or $Vr\beta$ depending on the number of cells. The number of cells in the battery is detected by charging the battery with a preliminary charge current for a predetermined period of time and comparing the battery voltage increased as a result of the preliminary charge with each of a plurality of reference voltages corresponding to the number of cells. Further, the battery can be determined as having reached the end of life when the battery voltage exceeds an appropriately set EOL discriminating voltage during charging. In this case, it is not necessary to set the preliminary charge time.

As described, the EOL discriminating voltages $Vr\alpha$ and $Vr\beta$ vary depending on the charge currents $I\alpha$ and $I\beta$, respectively. If the charge currents $I\alpha$ and $I\beta$ are set larger for charging rapidly chargeable batteries charged with for example 5C, the EOL discriminating voltages are also set larger whereas the charge currents $I\alpha$ and $I\beta$ are set smaller for charging standard type batteries charged with, for example, less than 1C, the EOL discriminating voltages are also set smaller. The EOL discriminating voltages $Vr\alpha$ and $Vr\beta$ also vary depending on the temperature of the battery.

Examples of EOL discriminating voltages set depending on the battery temperature, the number of cells in the battery, and the charge current, are indicated in Tables 1 through 8 below. A rapidly chargeable battery (1700 mAh) is subjected to EOL discrimination by EOL discriminating voltages. A rated voltage of each cell in the battery is 1.2 V. Four kinds of batteries of 7.2 V with 6 cells, 9.6 V with 8 cells, 12 V with 10 cells and 24 V with 20 cells are charged with charge current $I\alpha$ of 4C.

TABLE 1

BATTERY TEMPERATURE RANGE OF –10° TO 0° C.

| BATTERY SIZE (V) | EOL DISCRIMINATING VOLTAGE $Vr\alpha$ (V) |
|---|---|
| 7.2 V (6 CELLS) | 11.1 V |
| 9.6 V (8 CELLS) | 14.8 V |
| 12 V (10 CELLS) | 18.5 V |
| 24 V (20 CELLS) | 37.0 V |

TABLE 2

BATTERY TEMPERATURE RANGE OF 0° TO 15° C.

| BATTERY SIZE (V) | EOL DISCRIMINATING VOLTAGE $Vr\alpha$ (V) |
|---|---|
| 7.2 V (6 CELLS) | 10.5 V |
| 9.6 V (8 CELLS) | 14.0 V |
| 12 V (10 CELLS) | 17.5 V |
| 24 V (20 CELLS) | 35.0 V |

TABLE 3

BATTERY TEMPERATURE RANGE OF 15° TO 30° C.

| BATTERY SIZE (V) | EOL DISCRIMINATING VOLTAGE $Vr\alpha$ (V) |
|---|---|
| 7.2 V (6 CELLS) | 10.2 V |
| 9.6 V (8 CELLS) | 13.6 V |
| 12 V (10 CELLS) | 17.0 V |
| 24 V (20 CELLS) | 34.0 V |

TABLE 4

BATTERY TEMPERATURE RANGE OF 30° TO 60° C.

| BATTERY SIZE (V) | EOL DISCRIMINATING VOLTAGE $Vr\alpha$ (V) |
|---|---|
| 7.2 V (6 CELLS) | 9.9 V |
| 9.6 V (8 CELLS) | 13.2 V |
| 12 V (10 CELLS) | 16.5 V |
| 24 V (20 CELLS) | 33.0 V |

Examples of EOL discriminating voltages corresponding to the cell number in the battery (represented by battery voltage) are shown in Tables 5–8 below in which the reference temperature value Tref for determining low-temperature batteries is set to 0° C., the first charge current $I\alpha$ is set to 3C, and the second charge current $I\beta$ is set to 1C. As in the example shown in Tables 1–4, rapidly chargeable batteries (1700 mAh) are subjected to EOL discrimination.

TABLE 5

BATTERY TEMPERATURE RANGE OF –10° TO 0° C.

| BATTERY SIZE (V) | EOL DISCRIMINATING VOLTAGE $Vr\beta$ (V) |
|---|---|
| 7.2 V (6 CELLS) | 10.8 V |
| 9.6 V (8 CELLS) | 14.4 V |
| 12 V (10 CELLS) | 18.0 V |
| 24 V (20 CELLS) | 36.0 V |

TABLE 6

BATTERY TEMPERATURE RANGE OF 0° TO 15° C.

| BATTERY SIZE (V) | EOL DISCRIMINATING VOLTAGE $V_{r\alpha}$ (V) |
|---|---|
| 7.2 V (6 CELLS) | 10.3 V |
| 9.6 V (8 CELLS) | 13.7 V |
| 12 V (10 CELLS) | 17.2 V |
| 24 V (20 CELLS) | 34.3 V |

TABLE 7

BATTERY TEMPERATURE RANGE OF 15° TO 30° C.

| BATTERY SIZE (V) | EOL DISCRIMINATING VOLTAGE $V_{r\alpha}$ (V) |
|---|---|
| 7.2 V (6 CELLS) | 10.0 V |
| 9.6 V (8 CELLS) | 13.4 V |
| 12 V (10 CELLS) | 16.8 V |
| 24 V (20 CELLS) | 33.5 V |

TABLE 8

BATTERY TEMPERATURE RANGE OF 30° TO 60° C.

| BATTERY SIZE (V) | EOL DISCRIMINATING VOLTAGE $V_{r\alpha}$ (V) |
|---|---|
| 7.2 V (6 CELLS) | 9.7 V |
| 9.6 V (8 CELLS) | 13.0 V |
| 12 V (10 CELLS) | 16.3 V |
| 24 V (20 CELLS) | 32.5 V |

What is claimed is:

1. A rechargeable battery service-life discriminating device for discriminating an end of life of a rechargeable battery, comprising:
   charging means for charging the battery with a charge current;
   battery voltage detecting means for detecting a battery voltage;
   first comparison means for comparing the battery voltage detected by said battery voltage detecting means with a predetermined reference voltage; and
   determining means for determining that the battery has reached the end of life when said first comparison means indicates that the battery voltage is above the predetermined reference voltage during an initial period of charging.

2. The device according to claim 1, further comprising temperature detecting means for detecting a battery temperature at the start of charge, and second comparison means for comparing the battery temperature detected by said temperature detecting means with a predetermined reference temperature, and wherein when said second comparison means indicates that the battery temperature is lower than the predetermined reference temperature, the charge current is set to have a second level smaller than a first level.

3. The device according to claim 1, further comprising temperature detecting means for detecting a battery temperature at the start of charge, and wherein the predetermined reference voltage is changed depending on the battery temperature.

4. The device according to claim 1, wherein the predetermined reference voltage is changed depending on the charge current.

5. A battery charger for charging a rechargeable battery having a plurality of cells connected in series, comprising:
   charging means for charging the battery with a charge current;
   battery voltage detecting means for detecting a maximum voltage of the battery; and
   end-of-life detecting means for detecting that the battery has reached an end of life based on the maximum voltage of the battery detected by said battery voltage detecting means during an initial period of charging and producing an end-of-life signal.

6. The battery charger according to claim 5, further comprising temperature detecting means for detecting a battery temperature at the start of charge, and wherein the charge current is determined by said charging means depending on the battery temperature.

7. The battery charger according to claim 6, further comprising cell number detecting means for detecting a number of cells of the battery, and wherein said end-of-life detecting means detects that the battery has reached the end of life based on the number of cells of the battery.

8. The battery charger according to claim 5, further comprising indicating means for indicating that the battery has reached the end of life in response to the end-of-life signal.

* * * * *